US012757622B2

(12) United States Patent
Lee et al.

(10) Patent No.: US 12,757,622 B2
(45) Date of Patent: Oct. 6, 2026

(54) FOLDABLE DISPLAY APPARATUS

(71) Applicant: KOREA ADVANCED INSTITUTE OF SCIENCE AND TECHNOLOGY, Daejeon (KR)

(72) Inventors: Phill-Seung Lee, Daejeon (KR); Junhan Bae, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 337 days.

(21) Appl. No.: 18/690,463

(22) PCT Filed: Mar. 22, 2023

(86) PCT No.: PCT/KR2023/003774
§ 371 (c)(1),
(2) Date: Mar. 8, 2024

(87) PCT Pub. No.: WO2023/195662
PCT Pub. Date: Oct. 12, 2023

(65) Prior Publication Data

US 2024/0389447 A1 Nov. 21, 2024

(30) Foreign Application Priority Data

Apr. 8, 2022 (KR) ........................ 10-2022-0043891
Jun. 10, 2022 (KR) ........................ 10-2022-0070546

(51) Int. Cl.
*H10K 77/10* (2023.01)
*H10K 59/80* (2023.01)
*H10K 102/00* (2023.01)

(52) U.S. Cl.
CPC ......... *H10K 77/111* (2023.02); *H10K 59/873* (2023.02); *H10K 2102/351* (2023.02)

(58) Field of Classification Search
CPC ............... H10K 77/111; H10K 59/873; H10K 2102/351
See application file for complete search history.

(56) References Cited

U.S. PATENT DOCUMENTS 11,221,648 B2 1/2022 Myeong et al.
11,232,722 B2 * 1/2022 Park ...................... G06F 1/1652
(Continued)

FOREIGN PATENT DOCUMENTS

CN 113888964 A 1/2022
JP 2011040269 A 2/2011
(Continued)

OTHER PUBLICATIONS

First Office Action for Korean Patent Application No. KR20220070546, dated Aug. 10, 2023.
(Continued)

*Primary Examiner* — Thao P Le
(74) *Attorney, Agent, or Firm* — Troutman Pepper Locke LLP; Christopher J. Capelli

(57) ABSTRACT

A foldable display apparatus according to an embodiment of the present disclosure may include a display panel, a support plate and an adhesive layer. The display panel may be defined with a flat area and a folding area folded about an extended folding axis defined along a first direction and may be capable of displaying an image. The support plate may be disposed beneath the display panel and overlap with the flat area. The adhesive layer may fix the display panel and the support plate. The adhesive layer may overlap with the flat area of the display panel and be non-overlapping with the folding area of the display panel. The adhesive layer may include a first adhesive layer and a second adhesive layer, the first adhesive layer and the second adhesive being spaced apart from each other in the first direction. In a plan view, the first and second adhesive layers may be disposed along sides
(Continued)

extended in a second direction intersecting the first direction of the display panel.

13 Claims, 9 Drawing Sheets

(56) References Cited

U.S. PATENT DOCUMENTS

| | | | | |
|---|---|---|---|---|
| 11,240,920 | B2 * | 2/2022 | Jeon | H05K 5/0217 |
| 11,609,606 | B2 | 3/2023 | Myeong et al. | |
| 11,899,507 | B2 * | 2/2024 | Lee | G06F 1/1652 |
| 2021/0029841 | A1 | 1/2021 | Kim et al. | |
| 2021/0041602 | A1 | 2/2021 | Gudsøe | |
| 2021/0092855 | A1 * | 3/2021 | Choi | G06F 1/1641 |
| 2021/0109566 | A1 | 4/2021 | Myeong et al. | |
| 2021/0191459 | A1 | 6/2021 | Kim et al. | |
| 2022/0147102 | A1 * | 5/2022 | Kishimoto | G06F 1/1656 |
| 2022/0192041 | A1 * | 6/2022 | Jeon | G06F 1/1641 |
| 2022/0238821 | A1 * | 7/2022 | Cho | G06F 1/1652 |
| 2024/0187508 | A1 * | 6/2024 | Soh | H04M 1/0214 |

FOREIGN PATENT DOCUMENTS

| | | | |
|---|---|---|---|
| JP | 2014235257 | A | 12/2014 |
| JP | 2021140082 | A | 9/2021 |
| KR | 20140005404 | A | 1/2014 |
| KR | 20200069952 | A | 6/2020 |
| KR | 20200097852 | A | 8/2020 |

OTHER PUBLICATIONS

Second Office Action for Korean Patent Application No. KR20220070546, dated Feb. 19, 2024.

International Search Report and Written Opinion for PCT Application No. PCT/KR2023/003774, dated Jun. 27, 2023.

Office Action for Chinese Patent Application No. CN202380013033.7, dated Mar. 1, 2026.

Extended European Search Report for European Patent Application No. EP23784890.8, dated Feb. 13, 2026.

* cited by examiner

FOLDABLE DISPLAY APPARATUS

TECHNICAL FIELD

The present disclosure relates to a foldable display apparatus, and more specifically to preventing wrinkles from being created at a folding area of a foldable display apparatus.

BACKGROUND

The size of portable terminals, such as smartphones and tablet PCs, continues to be demanded to be smaller for improved portability. On the other hand, as consumers require displays larger than a certain screen size, flexible display devices, such as rollable or foldable displays, are being actively developed.

FIGS. 1A and 1B illustrate a case where wrinkles are visible when a foldable display apparatus is unfolded. The foldable display is subjected to stress from warpage due to repeated bending and unbending, resulting in wrinkles (wk) on the display as shown in FIG. 1. Such wrinkles (wk) on the display make the content screen itself appear wrinkled, significantly compromising the integrity of the portable terminal and leading to a substantial loss of product and brand reliability among users.

SUMMARY

The present disclosure is aimed at preventing wrinkles from occurring at the display panel of a foldable display apparatus.

A foldable display apparatus according to an embodiment of the present disclosure may include a display panel, a support plate and an adhesive layer.

The display panel may be defined with a flat area and a folding area folded about an extended folding axis defined along a first direction and may be capable of displaying an image.

The support plate may be disposed beneath the display panel and overlap with the flat area.

The adhesive layer may fix the display panel and the support plate.

The adhesive layer may overlap with the flat area of the display panel and be non-overlapping with the folding area of the display panel.

The adhesive layer may include a first adhesive layer and a second adhesive layer, the first adhesive layer and the second adhesive being spaced apart from each other in the first direction.

In a plan view, the first adhesive layer may be disposed along a first side extending in a second direction intersecting the first direction of the display panel.

In a plan view, the second adhesive layer may be disposed along a second side extending in the second direction of the display panel and facing the first side.

In a plan view, the first adhesive layer and the second adhesive layer may not be disposed in an area extending from the center of the folding area to the flat area in the first direction.

The adhesive layer may further include a third adhesive layer disposed along a third side extending in the first direction of the display panel.

The first adhesive layer and the second adhesive layer may be interposed between the display panel and the support plate and adhered to the support plate and the display panel.

The foldable display apparatus may further include a resin layer, the resin layer being attached to the support plate and the display panel. The resin layer may include a first resin layer and a second resin layer, the first resin layer and the second resin layer being spaced apart from each other in the first direction. The first resin layer may be disposed along the first side of the display panel. The second resin layer may be disposed along the second side of the display panel. The first adhesive layer may be disposed beneath the first resin layer such that the first resin layer may be attached to the display panel and the support plate by the first adhesive layer. The second adhesive layer may be disposed beneath the second resin layer such that the second resin layer may be attached to the display panel and the support plate by the second adhesive layer.

The first resin layer and the first adhesive layer may have a width in the first direction so as to overlap the display panel and the support plate around the first side of the display panel. The second resin layer and the second adhesive layer may have a width in the first direction so as to overlap the display panel and the support plate around the second side of the display panel.

The foldable display apparatus may further include a cover layer disposed on the display panel to cover a front face of the display panel. The first adhesive layer and the second adhesive layer may be disposed beneath the cover layer such that the cover layer may be attached to the display panel and the support plate by the first and second adhesive layers.

The first adhesive layer may have a width in the first direction so as to overlap the display panel and the support plate around the first side of the display panel. The second adhesive layer may have a width in the first direction so as to overlap the display panel and the support plate around the second side of the display panel.

The first adhesive layer and the second adhesive layer may be non-overlapping with the display panel while overlapping with the support plate. The first adhesive layer may attach the support plate and the cover layer at an outer edge of the first side of the display panel. The second adhesive layer may attach the support plate and the cover layer at an outer edge of the second side of the display panel.

The foldable display apparatus may further include a cover layer disposed on the display panel to cover the front face of the display panel. The cover layer may wrap around the sides of the display panel and the sides of the support plate and may be fixed to a bottom of the support plate by the adhesive layer.

The first adhesive layer and the second adhesive layer may be disposed beneath the support plate to attach an end portion of the cover layer wrapping around the display panel and the support plate to the bottom of the support plate.

Each of the first adhesive layer and the second adhesive layer may include a plurality of sub-adhesive layers, and sub-adhesive layers included in the first adhesive layer and sub-adhesive layers included in the second adhesive layer may be spaced apart from each other in the second direction.

A foldable display apparatus according to another embodiment of the present disclosure may include a display panel, a support plate and an adhesive layer.

The display panel may be defined with a flat area and a folding area folded about an extended folding axis defined along a first direction and may be capable of displaying an image.

The support plate may be disposed beneath the display panel and overlap with the flat area.

The adhesive layer may fix the display panel and the support plate.

The adhesive layer may include a first adhesive layer and a second adhesive layer, the first adhesive layer and the second adhesive being spaced apart from each other in the first direction.

In a plan view, the first adhesive layer may be disposed along a first side extending in a second direction intersecting the first direction of the display panel.

In a plan view, the second adhesive layer may be disposed along a second side extending in the second direction of the display panel and facing the first side.

In a plan view, the first adhesive layer and the second adhesive layer may not be disposed in an area extending from the center of the folding area to the flat area in the first direction.

According to embodiments of the present disclosure, the stress applied to the display panel when the foldable display apparatus is operating in a folded state is distributed not only in the folding area but also in non-adhesive areas, thereby avoiding plastic deformation in the configuration constituting the display panel and preventing the wrinkles from forming in the display panel overlapping the folding area.

Moreover, according to embodiments of the present disclosure, since the adhesive layer is not interposed between the display panel and the support plate, the display panel and the support plate have no difference in height therebetween and are more tightly adhered to each other, leading to improved durability and usability.

DETAILED DESCRIPTION

Figure 1A:
FIGS. 1A and 1B illustrate a case where wrinkles are visible when a foldable display apparatus is unfolded.
Figure 1B:
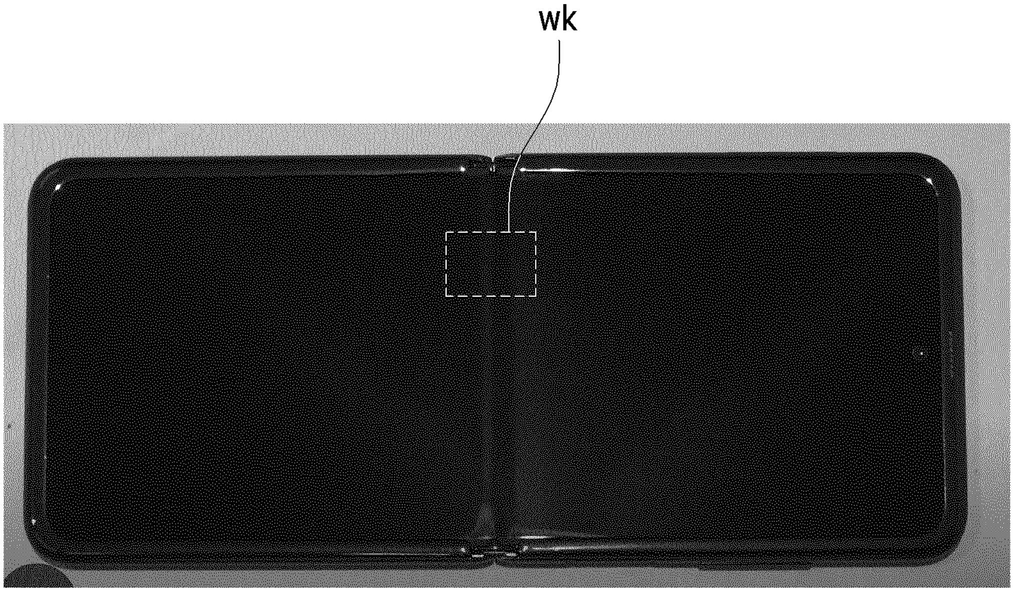

The embodiments described below are provided for illustrative purposes to aid in understanding the present disclosure, and it shall be appreciated that various modifications may be made to the described embodiments. Moreover, in describing the present disclosure, if a detailed description of a known function or element is deemed to unnecessarily obscure the essence of the present disclosure, such detailed description will be omitted.

The attached drawings are not illustrated to scale and may be exaggerated in certain dimensions to aid in understanding the disclosure. When reference numerals are assigned to the elements, the same reference numerals are used for the same elements, whenever possible, even if the elements are in different drawings.

Furthermore, in describing various elements of the embodiments of the present disclosure, terms such as first, second, A, B, (a), (b), etc. may be used. These terms are used to distinguish one element from another element and shall not limit the nature, order or sequence of the corresponding element. When an element is described to be "connected," "coupled," or "accessed" to another element, the element may be directly connected, coupled, or accessed to the other element, but it shall be appreciated that the element may be "connected," "coupled," or "accessed" to the other element by way of another element.

Therefore, the embodiments described in the present specification and the configurations illustrated in the drawings are merely the most preferable embodiments of the present disclosure and do not necessarily represent the entire technical ideas of the present disclosure, and thus it shall be appreciated that there may be various alternatives embodiments in the present disclosure.

The terms and words used in the specification and the claims shall not be limited to their ordinary or dictionary meanings but shall be interpreted in the context of the meanings and concepts that conform to the technical ideas of the present disclosure in accordance with the principle that the inventor may define the concept of a term to best describe his or her invention.

Moreover, unless explicitly indicated otherwise in the context, any singular form of expression shall also encompass a corresponding plural form of expression.

Figure 2:
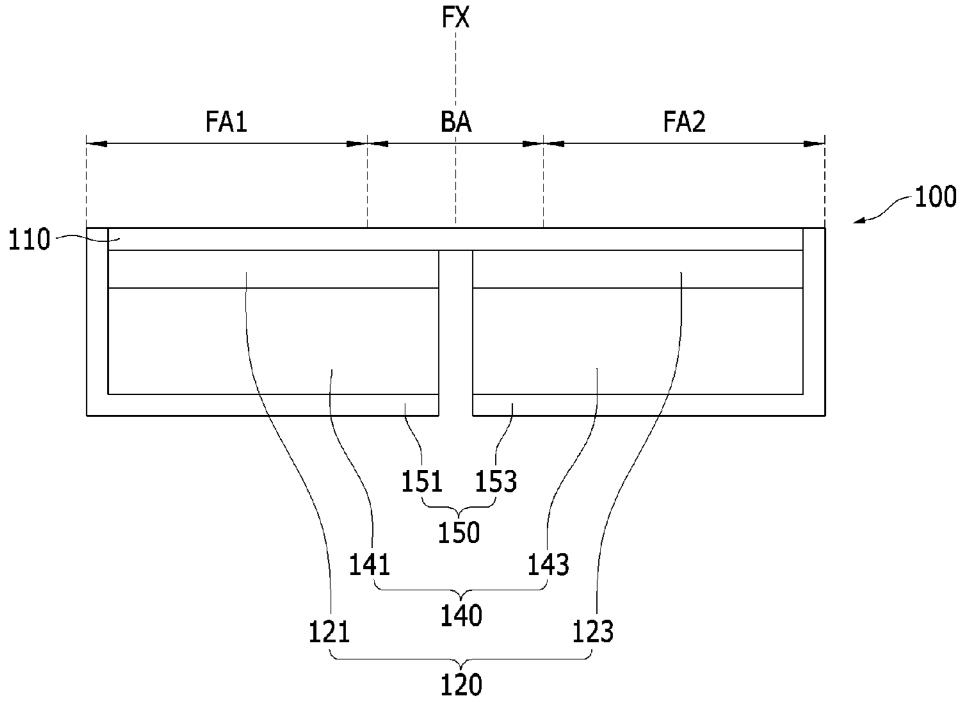
FIG. 2 illustrates a foldable display apparatus in an unfolded state.
Figure 3:
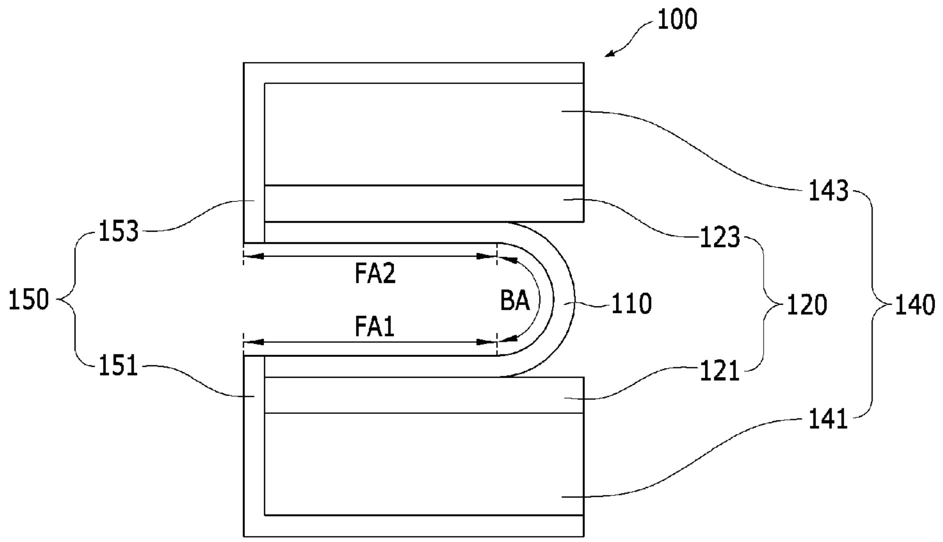
FIG. 3 is the foldable display apparatus in a folded state.

FIGS. 2 and 3 illustrate a foldable display apparatus in accordance with an embodiment of the present disclosure. FIG. 2 illustrates the foldable display apparatus in an unfolded state while FIG. 3 illustrates the foldable display apparatus in a folded state.

Referring to FIGS. 2 and 3, the foldable display apparatus 100 may include a display panel 110, a support plate 120, a display component part 140 and a housing 150.

In the present embodiment, the foldable display apparatus 100 may be any one of various devices, such as a portable terminal, a tablet PC, a laptop computer, a television set, which provides a display screen.

The display panel 110 may be flexible. For example, the display panel 110 may be an organic light-emitting diode (OLED) display panel. The display panel 110 may be driven in any variety of ways as long as it is flexible.

In an embodiment of the present disclosure, the display panel 110 may include a driving device, an OLED device and a sealing layer that are successively stacked on a substrate. Moreover, the display panel 110 may optionally include various functional layers, such as a buffer layer, a digitizer and a heat dissipation layer, which are attached to a lower surface of the substrate.

Defined in the foldable display apparatus 100 may be a folding area BA, being folded about a folding axis FX, and flat areas FA1, FA2. The flat areas may include a first flat area FA1 and a second flat area FA2 that face each other with the folding area BA therebetween.

While the foldable display apparatus 100 is folded, the display panel 110 overlapping the folding area BA may be folded. While the foldable display apparatus 100 is unfolded, the display panel 110 overlapping the folding area BA may be flat.

While the foldable display apparatus 100 is folded or unfolded, the display panel 110 overlapping the first and second flat areas FA1, FA2 may remain flat.

The support plate 120 may be disposed underneath the display panel 110. The support plate 120 may be made of a rigid material, for example, a metallic material.

The support plate 120 may include a first support plate 121 and a second support plate 123. The first support plate 121 may be disposed to overlap the first flat area FA1 to keep the display panel 110 of the first flat area FA1 from bending when the foldable display apparatus 100 is folded. The second support plate 123 may be disposed to overlap the second flat area FA2 to keep the display panel 110 of the second flat area FA2 from bending when the foldable display apparatus 100 is folded.

The display component part 140 may be disposed underneath the support plate 120.

The display component part 140 may include a component for implementing various functions of the foldable display apparatus 100 and a component for driving the display panel 110.

The display component part 140 may include a printed circuit board, an antenna module, a sensor module, a battery, a camera module, etc.

The display component part 140 may be provided in the form of components mounted on a rigid printed circuit board. The display component part 140 may include a first display component part 141 overlapping the first support plate 121 and a second display component part 143 overlapping the second support plate 123, and the first and second display component parts 141, 143 are separated from each other such that the foldable display apparatus 100 is operable in a folded stated.

The housing 150 may form an exterior of the foldable display apparatus 100. The housing 150 may have a receiving space provided therein, and the display panel 110, the support plate 120 and the display component part 140 may be received within the receiving space.

The housing 150 may include a first housing 151 and a second housing 153.

The foldable display apparatus 100 may further include a hinge module (now shown) overlapping the folding axis FX, and the first housing 151 and the second housing 153 may be rotatably coupled to the hinge module.

The hinge module may include a device required for controlling or maintaining a folding angle of the foldable display apparatus 100.

In the present embodiment, the hinge module may be positioned within the first housing 151 and the second housing 153 when the foldable display apparatus 100 is unfolded, as illustrated in FIG. 2, and may be exposed to a space between the first housing 151 and the second housing 153 when the foldable display apparatus 100 is folded, as illustrated in FIG. 3.

Exemplified for the foldable display apparatus 100 according to an embodiment of the present disclosure is an in-folding type, in which the surfaces displaying images of the display panel 110 are folded to face each other. However, the present disclosure is not limited to this embodiment, the foldable display apparatus according to another embodiment may be an out-folding type, in which the surfaces displaying images of the display panel 110 are outwardly folded away from each other.

The foldable display apparatus 100 according to an embodiment of the present disclosure may further include an adhesive layer.

The adhesive layer may be disposed to overlap the first and second flat areas FA1, FA2 and to be non-overlapping with the folding area BA. In an embodiment of the present disclosure, the adhesive layer may implement the folding state of the foldable display apparatus 100 by selectively attaching the display panel 110 and the support plate 120 in the first and second flat areas FA1, FA2 without attaching the display panel 110 and the support plate 120 in the folding area BA.

The adhesive layer may include at least one of OCA (optical clear adhesive), PSA (pressure sensitive adhesive), thermal reactive adhesive, general adhesive and double-sided tape.

The adhesive layer may fasten the display panel 110 and the support plate 120 either directly or indirectly. The adhesive layer directly fastens the display panel 110 and the support plate 120 by being placed between the display panel 110 and the support plate 120 and applying the adhesive force directly to the display panel 110 and the support plate 120. The adhesive layer indirectly fastens the display panel 110 and the support plate 120 by being attached to another element and providing fastening between the display panel 110 and the support plate 120.

In a plan view, the adhesive layer is disposed along the edges of the display panel and not disposed in certain areas of the first and second flat areas FA1, FA2 that are defined as non-adhesive areas, which will be described with reference to below embodiments.

Figure 4:
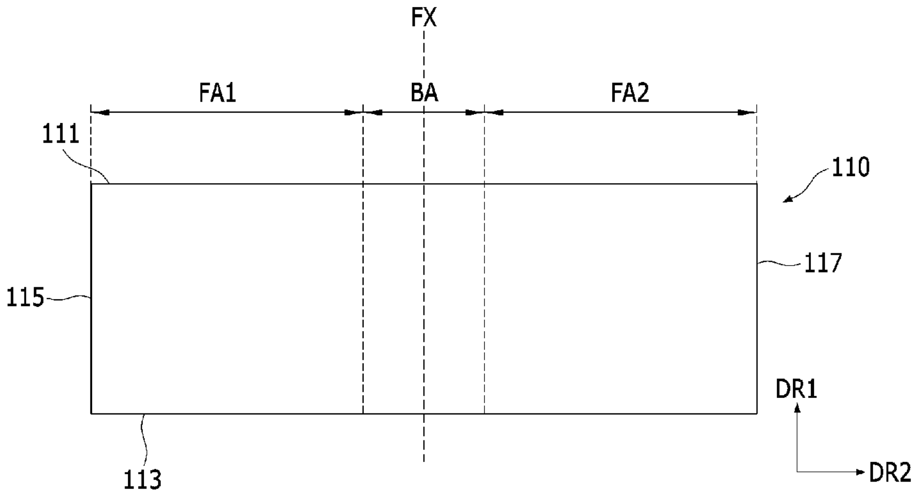
FIG. 4 is a plan view illustrating the display panel in accordance with an embodiment of the present disclosure.

FIG. 4 is a plan view illustrating the display panel in accordance with an embodiment of the present disclosure.

The folding axis FX may be defined along a first direction DR1. The display panel 110 may be provided in a rectangular shape on a plane. The display panel 110 may include a first side 111 and a second side 113 that are extended along a second direction DR2, which intersects the first direction DR1, and spaced apart from each other. Moreover, the display panel 110 may include a third side 115 and a fourth side 117 that are extended along the first direction DR1 and spaced apart from each other.

Figure 5A:
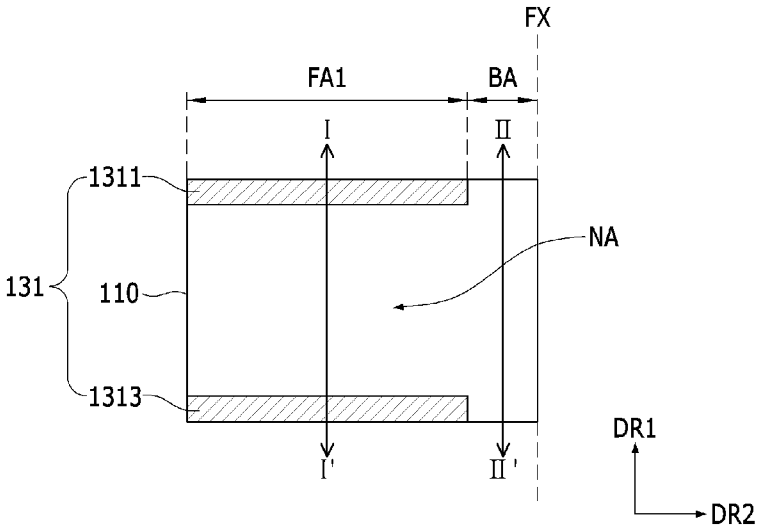
FIG. 5A is a plan view illustrating the display panel, the adhesive layer and the support plate of the foldable display apparatus in accordance with an embodiment of the present disclosure.
Figure 5B:
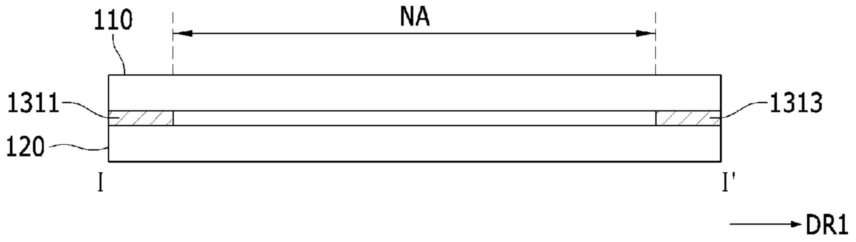
FIG. 5B is a cross-sectional view of the foldable display apparatus illustrated in FIG. 5A along the I-I' line.
Figure 5C:
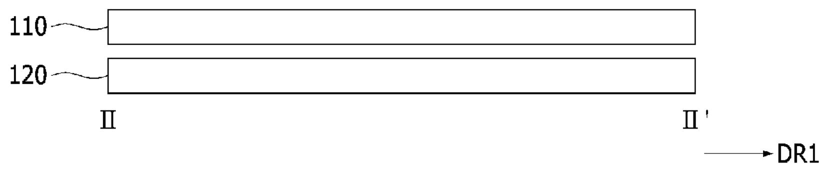
FIG. 5C is a cross-sectional view of the foldable display apparatus illustrated in FIG. 5A along the II-II' line.

FIG. 5A is a plan view illustrating the display panel, the adhesive layer and the support plate of the foldable display apparatus in accordance with an embodiment of the present disclosure, and FIG. 5B is a cross-sectional view of the foldable display apparatus illustrated in FIG. 5A along the I-I' line, FIG. 5C is a cross-sectional view of the foldable display apparatus illustrated in FIG. 5A along the II-II' line.

Illustrated in FIGS. 5A to 5C are the first flat area FA1 on one side of the folding axis FX and a portion of the display panel 110 overlapping the folding area BA, for the sake of convenience. Since the display panel and the support panel are fixed symmetrically about the folding axis FX, the structure on one side of the folding axis FX will only be described, and the structure on the other side of the folding axis FX will be omitted.

Referring to FIG. 4 and FIGS. 5A to 5C, an adhesive layer 131 may interposed between the support plate 120 and the display panel 110 to be attached to the support plate 120 and the display panel 110.

The adhesive layer 131 may include a first adhesive layer 1311 and a second adhesive layer 1313 that are space apart from each other.

The first adhesive layer 1311 may be extended in the second direction DR2 and disposed along the first side 111 of the display panel 110.

The second adhesive layer 1313 may be extended in the second direction DR2 and disposed along the second side 113 of the display panel 110. The display panel 110 and the support plate 120 may be fixed to each other by the first adhesive layer 1311 and the second adhesive layer 1313. In the perspective of a plan view, the display panel 110 and the support plate 120 are not fixed in a portion of the first flat area FA1 between the first adhesive layer 1311 and the second adhesive layer 1313. In the perspective of a plan view, the portion of the first flat area FA1 between the first adhesive layer 1311 and the second adhesive layer 1313 may be defined as a non-adhesive area NA.

That is, the first adhesive layer 1311 and the second adhesive layer 1313 may not be disposed in the non-adhesive area NA, which is extended to the first flat area FA1 from the center of the folding area BA in the first direction DR1.

As a comparative example, when the adhesive layer is arranged to cover the entire first flat area FA1 in the plane between the display panel and the support plate, stress is concentrated in the folding area when the foldable display apparatus operates in the folded state. In such a case, the magnitude of the concentrated stress may cause plastic deformation in the configuration constituting the display panel to create permanent wrinkles in the display panel overlapping the folding area.

According to the foldable display apparatus of an embodiment of the present disclosure described with reference to FIGS. 5A to 5C, the stress applied to the display panel 110 when the foldable display apparatus is operating in the folded state is distributed not only in the folding area BA but also to the non-adhesive area NA between the first and second adhesive layers 1311, 1313, thereby not resulting in plastic deformation in the configuration constituting the display panel 110 but preventing wrinkles from forming in the display panel 110 overlapping the folding area BA.

Although not illustrated, in an embodiment of the present disclosure, each of the first adhesive layer 1311 and the second adhesive layer 1313 may include a plurality of sub-adhesive layers. The sub-adhesive layers included in the first adhesive layer 1311 and the sub-adhesive layers included in the second adhesive layer 1313 may be spaced apart from each other in the second direction DR2.

Figure 6:
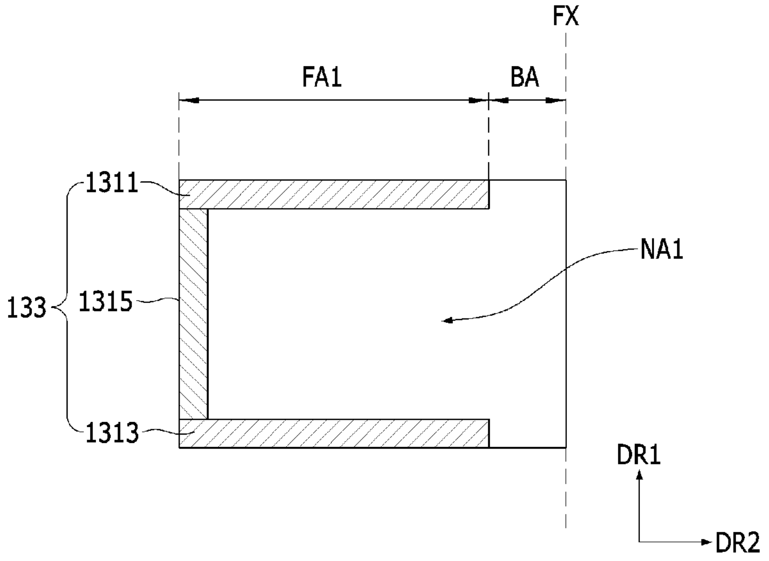
FIG. 6 is a plan view of the display panel, the adhesive layer and the support plate of the foldable display apparatus in accordance with another embodiment of the present disclosure.

FIG. 6 is a plan view of the display panel, the adhesive layer and the support plate of the foldable display apparatus in accordance with another embodiment of the present disclosure.

The foldable display apparatus that will be described with reference to FIG. 6 is characterized with further including a third adhesive layer 1315, compared to the foldable display apparatus described with reference to FIGS. 5A to 5C.

Referring to FIG. 4 and FIG. 6, the adhesive layer 133 may further include the third adhesive layer 1315.

The third adhesive layer 1315 may be interposed between the display panel 110 and the support plate 120, which are described with reference to FIGS. 5A to 5C, and provide attachment between the support plate 120 and the display panel 110.

The third adhesive layer 1315 may be extended in the first direction DR1 and disposed along the third side 115 of the display panel 110. The third adhesive layer 1315 may be connected to or integrated with the first and second adhesive layers 1311, 1313, but the configuration of the third adhesive layer 1315 is not limited to this structure.

In a plan view, a portion of the first flat area FA1 surrounded by the first to third adhesive layers 1311, 1313, 1315 may be defined as a non-adhesive area NA1.

According to the embodiment illustrated in FIG. 6, when the foldable display apparatus is operating in the folded state, the stress applied to the display panel 110 is distributed to the non-adhesive area NA1, thereby resulting in prevention of wrinkles in the display panel 110 overlapping the folding area BA.

Figure 7A:
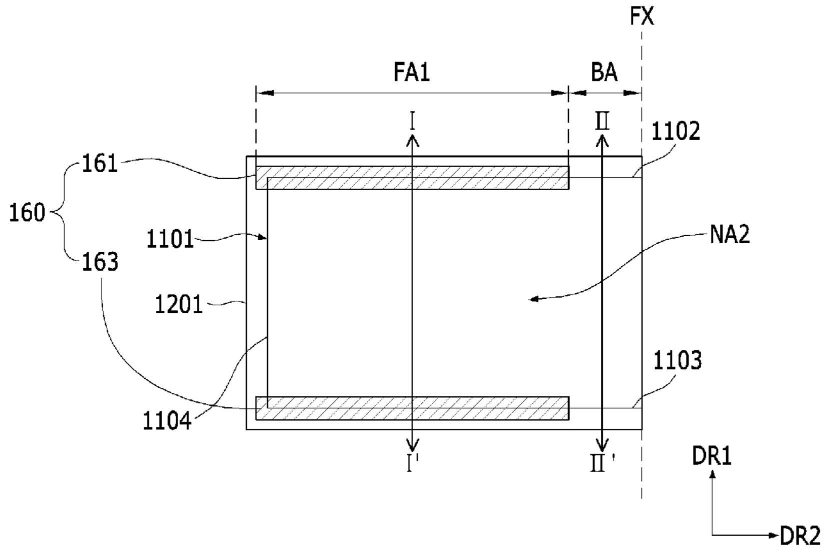
FIG. 7A is a plan view of a display panel, an adhesive layer and a support plate of a foldable display apparatus in accordance with another embodiment of the present disclosure.
Figure 7B:
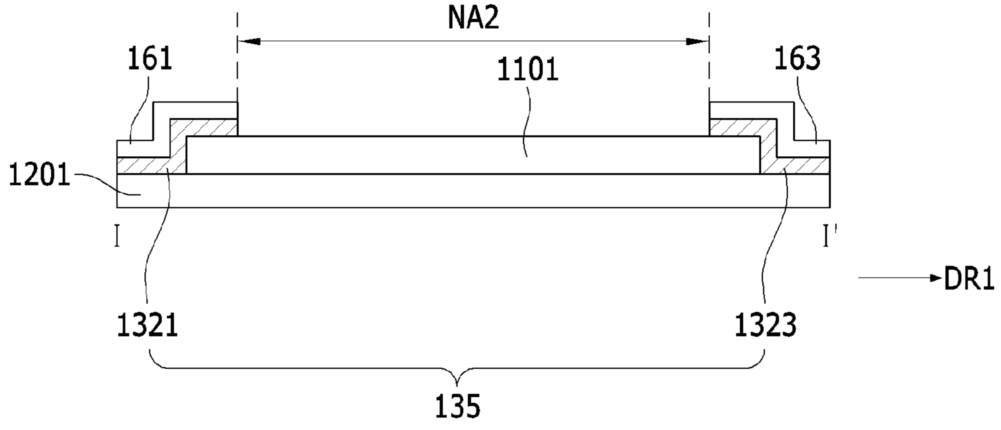
FIG. 7B is a cross-sectional view of the foldable display apparatus illustrated in FIG. 7A along the I-I' line.
Figure 7C:
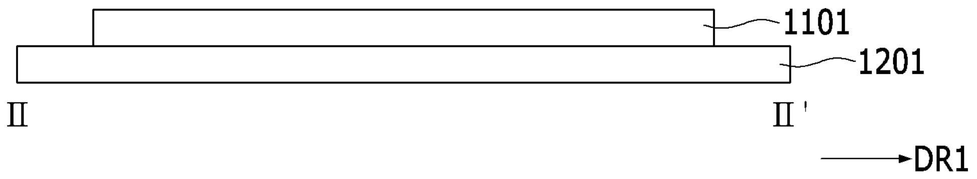
FIG. 7C is a cross-sectional view of the foldable display apparatus illustrated in FIG. 7A along the II-II' line.

FIG. 7A is a plan view of a display panel, an adhesive layer and a support plate of a foldable display apparatus in accordance with another embodiment of the present disclosure, and FIG. 7B is a cross-sectional view of the foldable display apparatus illustrated in FIG. 7A along the I-I' line, and FIG. 7C is a cross-sectional view of the foldable display apparatus illustrated in FIG. 7A along the II-II' line.

Referring to FIGS. 7A to 7C, in the plan view, a support plate 1201 may have a larger area than a display panel 1101. Specifically, the support plate 1201 may have a greater width in a first direction DR1 than the display panel 1101.

In the present embodiment, no adhesive force may be applied between the display panel 1101 and the support plate 1201.

The foldable display apparatus may further include a resin layer 160. The resin layer 160 may be made of a transparent or translucent material, which may not affect the visibility.

The resin layer 160 may be attached to the support plate 1201 and the display panel 1101 by an adhesive layer 135 to indirectly fasten the support plate 1201 and the display panel 1101. The resin layer 160 may be disposed to overlap a first flat area FA1 and not to overlap a folding area BA.

The resin layer 160 may include a first resin layer 161 and a second resin layer 163 that are spaced apart from each other.

The first resin layer 161 may be extended in a second direction DR2. The first resin layer 161 may have a width in the first direction DR1 so as to overlap the display panel 1101 and the support plate 1201 around a first side 1102 of the display panel 1101.

The second resin layer 163 may be extended in the second direction DR2. The second resin layer 163 may have a width in the first direction DR1 so as to overlap the display panel 1101 and the support plate 1201 around a second side 1103 of the display panel 1101.

The adhesive layer 135 may include a first adhesive layer 1321 and a second adhesive layer 1323 that are disposed underneath the resin layer 160. The first resin layer 161 may be attached to the display panel 1101 and the support plate 1201 by the first adhesive layer 1321, and the second resin layer 163 may be attached to the display panel 1101 and the support plate 1201 by the second adhesive layer 1323.

In a plan view, the first adhesive layer 1321 and the second adhesive layer 1323 may have similar shapes, respectively, to the first resin layer 161 and the second resin layer 163.

While the resin layer 160 and the adhesive layer 135 are illustrated to be separate elements in the present embodiment, the present disclosure is not limited to this embodiment, and the resin layer 160 and the adhesive layer 135 may be provided as a single transparent tape having adhesiveness on one surface thereof.

With the foldable display apparatus described with reference to FIGS. 7A to 7C, the stress applied to the display panel 1101 when the foldable display apparatus is operating in a folded state is distributed to a non-adhesive area NA2, resulting in prevention of wrinkles in the display panel 1101 overlapping the folding area BA.

Moreover, since the adhesive layer 135 is not interposed between the display panel 1101 and the support plate 1201, the display panel 1101 and the support plate 1201 may have no difference in height therebetween and be more tightly adhered to each other, leading to improved durability and usability.

Figure 8A:
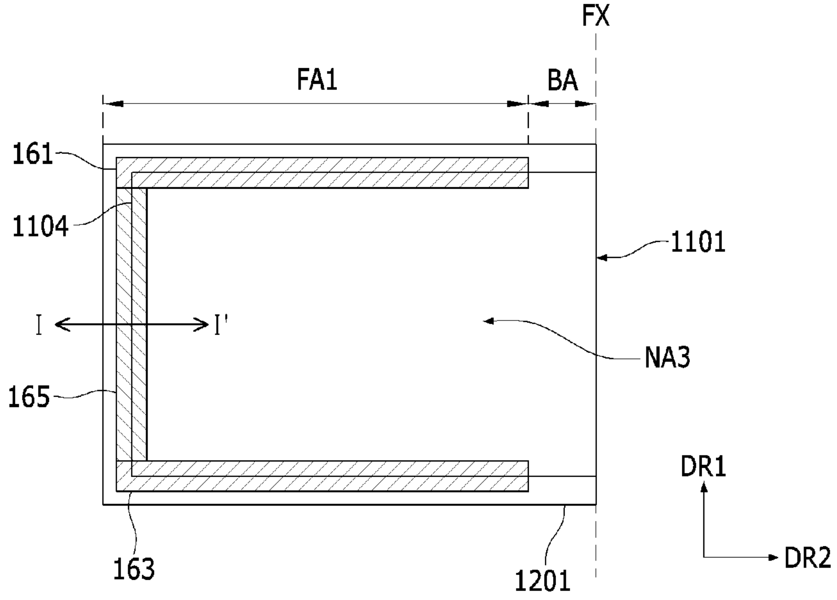
FIG. 8A is a plan view of a display panel, an adhesive layer and a support plate of a foldable display apparatus in accordance with yet another embodiment of the present disclosure.
Figure 8B:
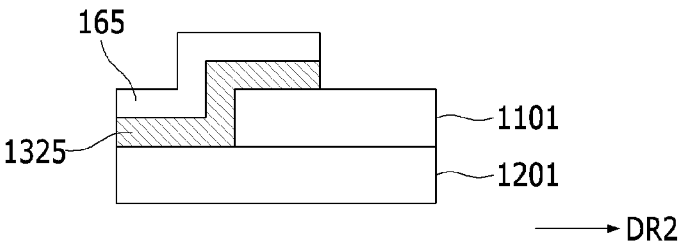
FIG. 8B is a cross-sectional view of the foldable display apparatus illustrated in FIG. 8A along the I-I' line.

FIG. 8A is a plan view of a display panel, an adhesive layer and a support plate of a foldable display apparatus in accordance with yet another embodiment of the present disclosure, and FIG. 8B is a cross-sectional view of the foldable display apparatus illustrated in FIG. 8A along the I-I' line.

The foldable display apparatus that will be described with reference to FIGS. 8A and 8B is characterized with further including a third resin layer 165 and a third adhesive layer 1325, compared to the foldable display apparatus described with reference to FIGS. 7A to 7C.

In the plan view, a support plate 1201 may have a greater width than a display panel 1101 not only in a first direction DR1 but also in a second direction DR2.

The third resin layer 165 may be extended along the first direction DR1 and disposed along a third side 1104 of the display panel 1101. The third resin layer 165 may overlap the display panel 1101 and the support plate 1201 around the third side 1104 of the display panel 1101.

The third resin layer 165 may be connected to or integrated with the first and second resin layers 161, 163, but the configuration of the third resin layer 165 is not limited to this structure.

The third resin layer 165 may be attached to the display panel 1101 and the support plate 1201 by the third adhesive layer 1325.

In a plan view, a portion of a first flat area FA1 surrounded by the first to third resin layers 161, 163, 165 may be defined as a non-adhesive area NA3.

With the foldable display apparatus described with reference to FIGS. 8A and 8B, the stress applied to the display panel 1101 when the foldable display apparatus is operating in a folded state is distributed to the non-adhesive area NA3, resulting in prevention of wrinkles in the display panel 1101 overlapping a folding area BA.

Figure 9A:
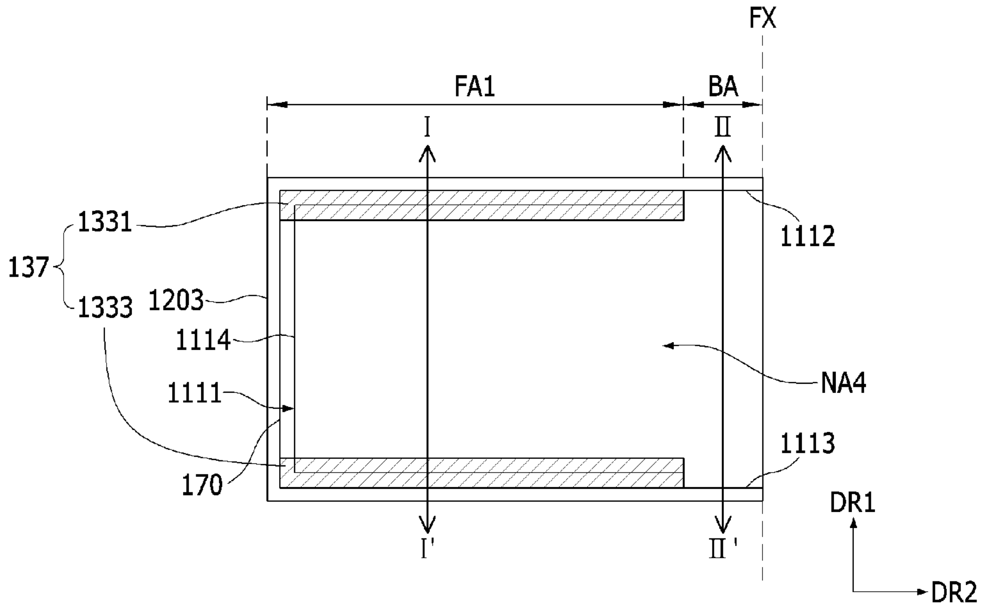
FIG. 9A is a plan view of a display panel, an adhesive layer and a support plate of a foldable display apparatus in accordance with still another embodiment of the present disclosure.
Figure 9B:
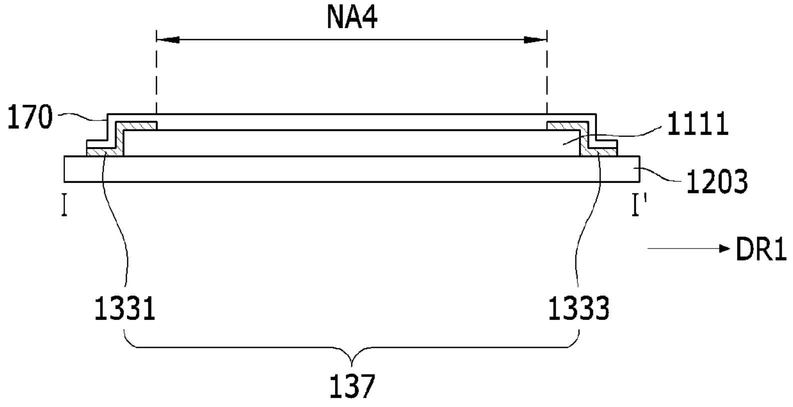
FIG. 9B is a cross-sectional view of the foldable display apparatus illustrated in FIG. 9A along the I-I' line.
Figure 9C:
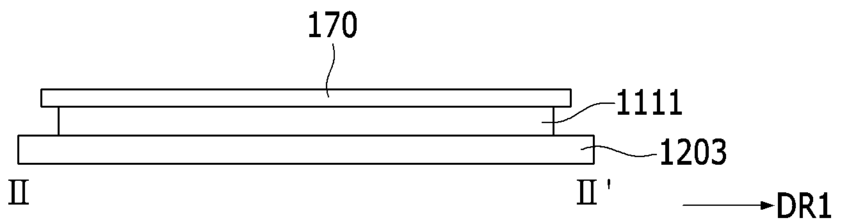
FIG. 9C is a cross-sectional view of the foldable display apparatus illustrated in FIG. 9A along the II-II' line.

FIG. 9A is a plan view of a display panel, an adhesive layer and a support plate of a foldable display apparatus in accordance with still another embodiment of the present disclosure, and FIG. 9B is a cross-sectional view of the foldable display apparatus illustrated in FIG. 9A along the I-I' line, and FIG. 9C is a cross-sectional view of the foldable display apparatus illustrated in FIG. 9A along the II-II' line.

Referring to FIGS. 9A to 9C, in the plan view, a support plate 1203 may have a larger area than a display panel 1111. Specifically, the support plate 1203 may have a greater width in a first direction DR1 than the display panel 1111.

In the present embodiment, no adhesive force may be applied between the display panel 1111 and the support plate 1203.

The foldable display apparatus may further include a cover layer 170. The cover layer 170 may be made of a transparent or translucent material, which may not affect the visibility.

The cover layer 170 may be one of various functional layers, such as for example a protective film, a polarizer plate, a touch layer or a cover window, arranged on the display panel 1111.

The cover layer 170 may be attached to the support plate 1203 and the display panel 1111 by an adhesive layer 137 to indirectly fasten the support plate 1203 and the display panel 1111. As the cover layer 170 covers the front face of the display panel 1111, the foldable display apparatus does not cause a difference in visibility in a first flat area FA1 and a folding area BA.

The adhesive layer 137 may include a first adhesive layer 1331 and a second adhesive layer 1333 that are spaced apart from each other in the first direction DR1.

The first adhesive layer 1331 may be extended in a second direction DR2. The first adhesive layer 1331 may have a width in the first direction DR1 so as to overlap the display panel 1111 and the support plate 1203 around a first side 1112 of the display panel 1111.

The second adhesive layer 1333 may be extended in the second direction DR2. The second adhesive layer 1333 may have a width in the first direction DR1 so as to overlap the display panel 1111 and the support plate 1203 around a second side 1113 of the display panel 1111.

The cover layer 170 may be attached to the display panel 1111 and the support plate 1203 along the first side 1112 and the second side 1113 of the display panel 1111 by the first adhesive layer 1331 and the second adhesive layer 1333.

The cover layer 170 may not be attached to the display panel 1111 in a non-adhesive area NA4 between the first and second adhesive layers 1331, 1333.

With the foldable display apparatus described with reference to FIGS. 9A to 9C, the stress applied to the display panel 1111 when the foldable display apparatus is operating in a folded state is distributed to the non-adhesive area NA4, resulting in prevention of wrinkles in the display panel 1111 overlapping the folding area BA.

Moreover, since the adhesive layer 137 is not interposed between the display panel 1111 and the support plate 1203, the display panel 1111 and the support plate 1203 may have no difference in height therebetween and be more tightly adhered to each other, leading to improved durability and usability.

Moreover, by utilizing the cover layer 170 that needs to be disposed over the display panel 1111 for the operation of the display apparatus to fix the display panel 1111 and the support plate 1203, without additional components, it is possible to reduce the number of parts and lower the manufacturing cost.

In another embodiment, the cover layer 170 may have different widths in the first direction DR1 depending on the area. Some area of the cover layer 170 overlapping the first flat area FA1 requires an area for adhesion by the adhesive layer 137 and thus may have a larger width in the first direction DR1 than the display panel 1111. Another area of the cover layer 170 overlapping the folding area BA does not have the adhesive layer 137 disposed therein and thus may have the substantially same width in the first direction DR1 as the display panel 1111.

In another embodiment, the cover layer 170 has a shape in a plane with a portion removed from a rectangular shape, and thus the end portion of the display panel 1111 and the cover layer 170 are fitted in with each other in the folding area BA, thereby improving the mechanical integrity of the foldable display apparatus.

Figure 10A:
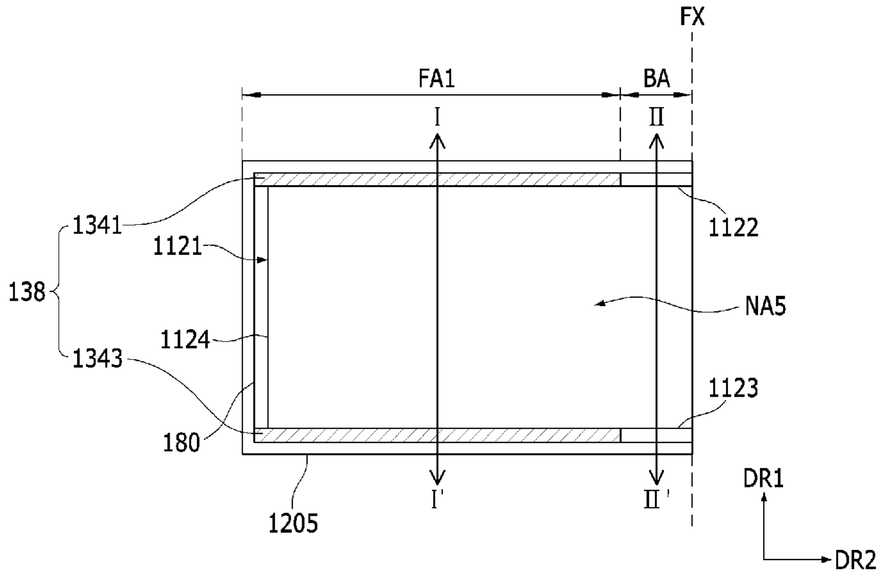
FIG. 10A is a plan view of a display panel, an adhesive layer and a support plate of a foldable display apparatus in accordance with still yet another embodiment of the present disclosure.
Figure 10B:
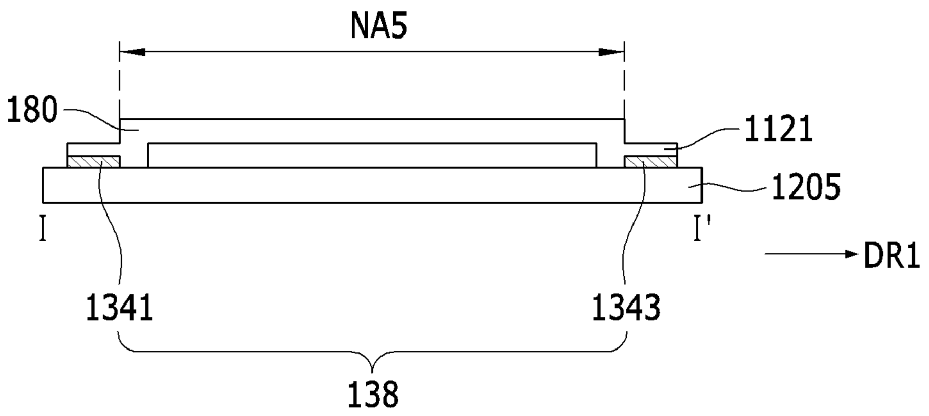
FIG. 10B is a cross-sectional view of the foldable display apparatus illustrated in FIG. 10A along the I-I' line.
Figure 10C:
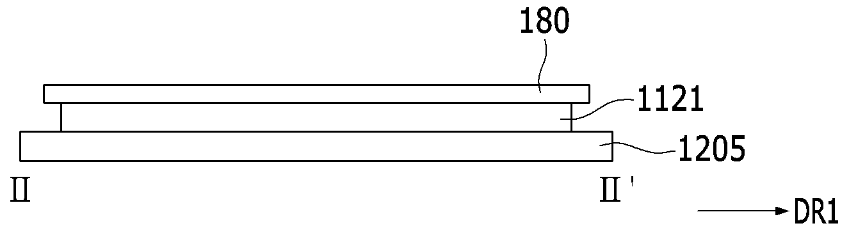
FIG. 10C is a cross-sectional view of the foldable display apparatus illustrated in FIG. 10A along the II-II' line.

FIG. 10A is a plan view of a display panel, an adhesive layer and a support plate of a foldable display apparatus in accordance with still yet another embodiment of the present disclosure, and FIG. 10B is a cross-sectional view of the foldable display apparatus illustrated in FIG. 10A along the I-I' line, and FIG. 10C is a cross-sectional view of the foldable display apparatus illustrated in FIG. 10A along the II-II' line.

The foldable display apparatus described with reference to FIGS. 10A to 10C is different in an adhesive layer 138 from the foldable display apparatus described with reference to FIGS. 9A to 9C, and the remaining elements may be substantially similar.

Hereinafter, the adhesive layer 138 will be mainly described, and the remaining elements will not be redundantly described.

The adhesive layer 138 illustrated in FIGS. 10A to 10C may have a smaller width in a first direction DR1 than the adhesive layer 137 shown in FIGS. 9A to 9C.

The adhesive layer 138 may include a first adhesive layer 1341 and a second adhesive layer 1343 that are spaced apart from each other in the first direction DR1.

The first adhesive layer 1341 and the second adhesive layer 1343 may be extended in a second direction DR2.

The first adhesive layer 1341 and the second adhesive layer 1343 may be non-overlapping with a display panel 1121 and overlapping with a support plate 1205. The first adhesive layer 1341 may attach the support plate 1205 and a cover layer 180 at an outer edge of a first side 1122 of the display panel 1121. The second adhesive layer 1343 may attach the support plate 1205 and the cover layer 180 at an outer edge of a second side 1123 of the display panel 1121.

The display panel 1121 and the cover layer 180 may be indirectly fastened by the first adhesive layer 1341 and the second adhesive layer 1343. The cover layer 180 may not be attached to the display panel 1121 in a non-adhesive area NA5 between the first and second adhesive layers 1341, 1343. Accordingly, the display panel 1121 may not be attached to the support plate 1205 and the cover layer 180 but still may be in direct contact with and tightly adhered to the support plate 1205 and the cover layer 180.

With the foldable display apparatus described with reference to FIGS. 10A to 10C, the stress applied to the display panel 1121 when the foldable display apparatus is operating in a folded state is distributed to the non-adhesive area NA5, resulting in prevention of wrinkles in the display panel 1121 overlapping the folding area BA.

Moreover, since the adhesive layer 138 is formed at the outer edge of the display panel 1121, no difference in height is formed between the display panel 1121 and the support plate 1205 and between the display panel 1121 and the cover layer 180, and the support plate 1205, the display panel 1121 and the cover layer 180 may be more tightly adhered to each other, leading to improved durability and usability.

Moreover, by utilizing the cover layer 180 that needs to be disposed over the display panel 1121 for the operation of the display apparatus to fix the display panel 1121 and the support plate 1205, without additional components, it is possible to reduce the number of parts and lower the manufacturing cost.

Although not illustrated, in the embodiments described with reference to FIGS. 9A to 10C, the foldable display apparatus may further include a third adhesive layer.

In the embodiments described with reference to FIGS. 9A to 10C, in a plan view, the support plate 1203, 1205 may have a larger width in the first direction DR1 than the display panel 1111, 1121.

In the embodiment illustrated in FIGS. 9A to 9C, the third adhesive layer may be extended in the first direction DR1 and disposed along a third side 1114 of the display panel 1111. The third adhesive layer may overlap the display panel 1111 and the support plate 1203 around the third side 1114 of the display panel 1111. The third adhesive layer may be disposed on the same layer as the first adhesive layer 1331 and the second adhesive layer 1333 to attach the display panel 1111 and the support plate 1203.

In the embodiment illustrated in FIGS. 10A to 10C, the third adhesive layer may be non-overlapping with the display panel 1121 and overlap with the support plate 1205. The third adhesive layer may be extended in the first direction DR1 and attach the support plate 1205 and the cover layer 180 at an outer edge of a third side 1124.

Figure 11A:
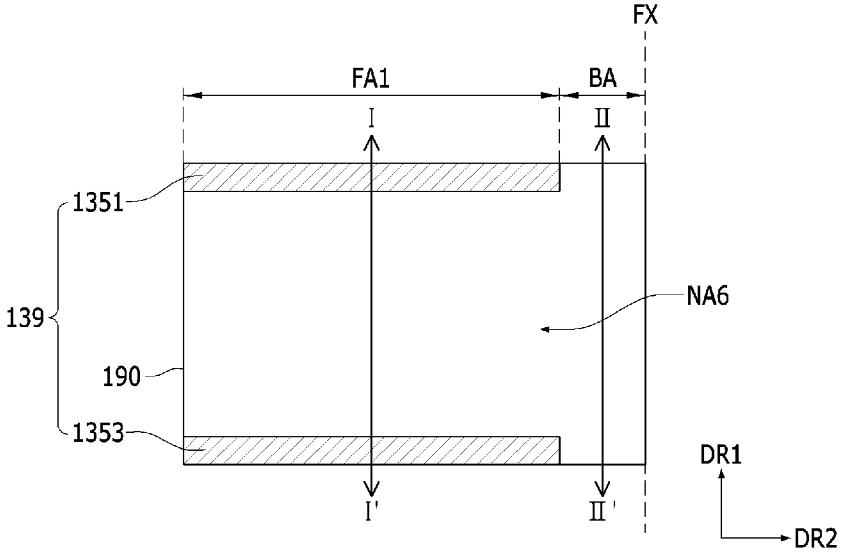
FIG. 11A is a plan view of a display panel, an adhesive layer, a support plate and a cover layer of a foldable display apparatus in accordance with still another embodiment of the present disclosure.
Figure 11B:
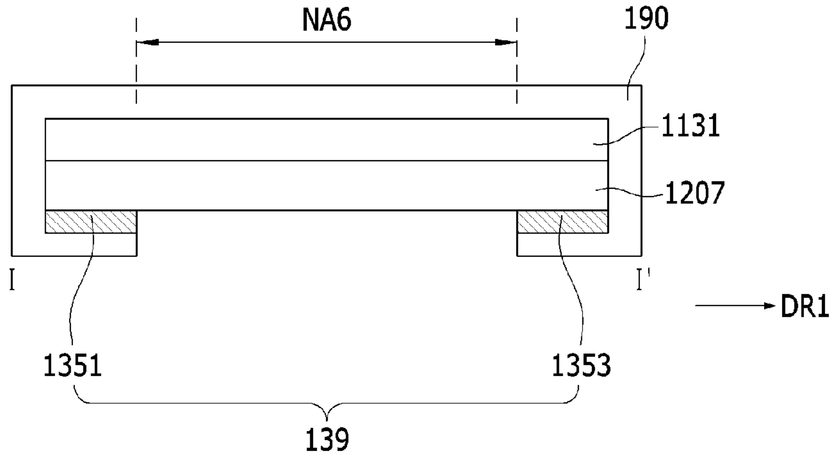
FIG. 11B is a cross-sectional view of the foldable display apparatus illustrated in FIG. 11A along the I-I' line.
Figure 11C:
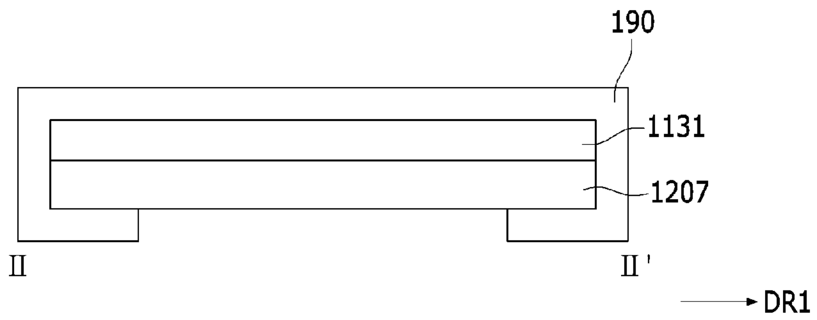
FIG. 11C is a cross-sectional view of the foldable display apparatus illustrated in FIG. 11A along the II-II' line.

FIG. 11A is a plan view of a display panel, an adhesive layer, a support plate and a cover layer of a foldable display apparatus in accordance with still another embodiment of the present disclosure, and FIG. 11B is a cross-sectional view of the foldable display apparatus illustrated in FIG. 11A along the I-I' line, and FIG. 11C is a cross-sectional view of the foldable display apparatus illustrated in FIG. 11A along the II-II' line.

Referring to FIGS. 11A to 11C, the foldable display apparatus may further include a cover layer 190. The cover layer 190 may be made of a transparent or translucent material, which may not affect the visibility.

The cover layer 190 may be one of various functional layers, such as for example a protective film, a polarizer plate, a touch layer or a cover window, arranged on the display panel 1131.

The cover layer 190 may have a larger area, in a plan view, than the display panel 1131 and a support plate 1207. The cover layer 190 may cover the front face of the display panel 1131, surround a lateral surface of the display panel 1131 and a lateral surface of the support plate 1207, and be fixed to a bottom of the support plate 1207.

An adhesive layer 139 may be disposed underneath the support plate 1207 to attach a bottom surface of the support plate 1207 and end portions of the cover layer 190 surrounding the display panel 1131 and the support plate 1207.

The adhesive layer 139 may include a first adhesive layer 1351 and a second adhesive layer 1353.

The first adhesive layer 1351 may be extended in a second direction DR2 and disposed along a first side of the display panel 1131. The second adhesive layer 1353 may be extended in the second direction DR2 and disposed along a side of the display panel 1131.

The positions of the first to fourth sides of the display panel 1131 may be identical to those of the display panel 110 described with reference to FIG. 4.

The cover layer 190 may be fixed to the support plate 1207 in some areas of a first flat area FA1, in a plan view, without being attached to the display panel 1131.

Since the adhesive layer 139 is not disposed on the cover layer 190 in a folding area BA, according to another embodiment of the present invention, the cover layer may have a width in the first direction DR1 corresponding to the display panel 1131 without surrounding the display panel 1131 in the folding area BA, unlike FIG. 11C.

With the foldable display apparatus described with reference to FIGS. 11A to 11C, the stress applied to the display panel 1131 when the foldable display apparatus is operating in a folded state is uniformly distributed to a non-adhesive area NA6, resulting in prevention of wrinkles in the display panel 1131 overlapping the folding area BA.

Moreover, with the cover layer 190 surrounding the display panel 1131 and the support plate 1207 and being fixed to the bottom of the support plate 1207, it is possible to minimize a non-displaying area (e.g., bezel), which is outside of the area displaying images, in the display panel 1131.

Figure 12:
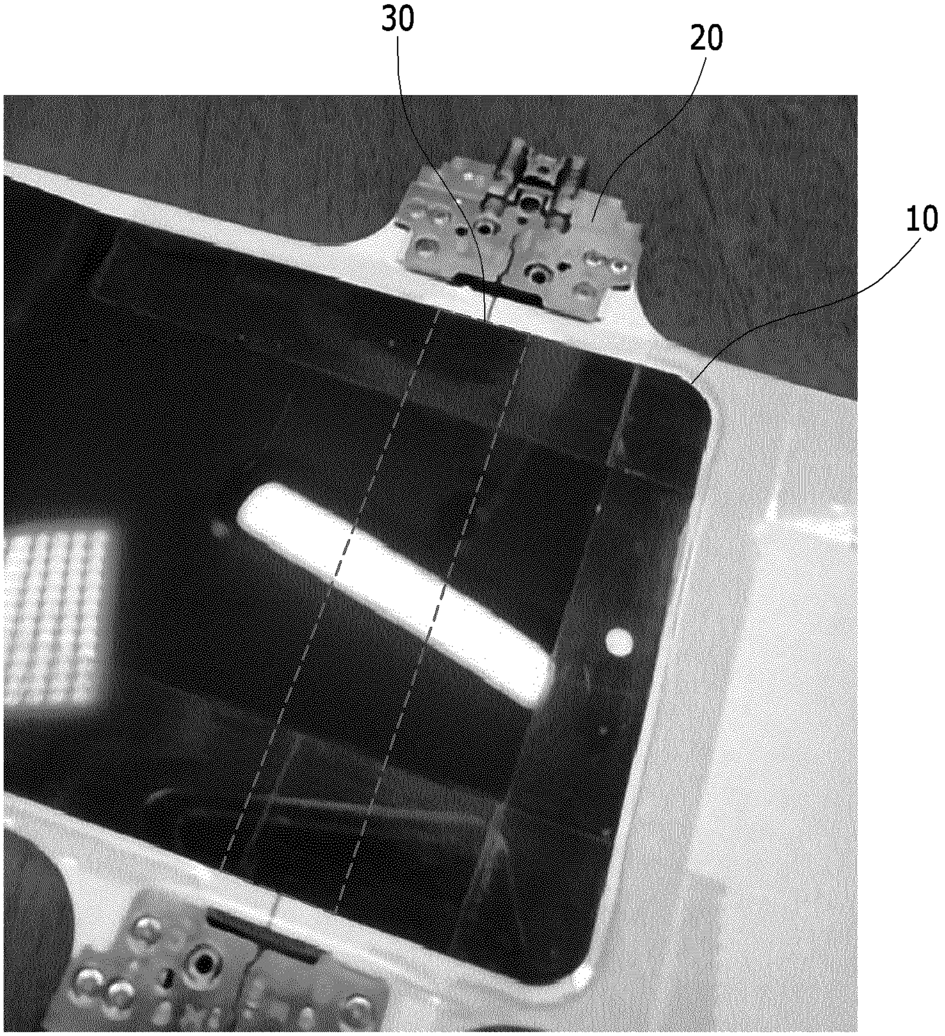
FIG. 12 is a photograph of the foldable display apparatus to which an embodiment of the present disclosure is applied.

FIG. 12 is a photograph of the foldable display apparatus to which an embodiment of the present disclosure is applied.

The foldable display apparatus 10 employing the present disclosure has been repeatedly folded and unfolded tens to hundreds of times using folding assistance mechanism 20 before this photograph was taken.

Referring to FIG. 12, when illuminated, for example, by LEDs, it was confirmed that no wrinkles were visible in a folding area 30 of the foldable display apparatus 10 and that the reflected LEDs appeared completely straight without any distortion of image. Moreover, when the folding area 30 of the foldable display apparatus 10 was touched, no wrinkles were felt tactilely, and the folding area 30 did not feel different from the flat areas.

Hitherto, certain embodiments of the present disclosure have been described with reference to the attached drawings, but the present disclosure shall not be limited to the described embodiments and may be variously modified without departing from the technical ideas of the present disclosure.

Therefore, it shall be appreciated that the described embodiments of the present disclosure are not to limit but to illustrate the technical ideas of the present disclosure, of which the scope is not limited by these embodiments. Accordingly, it shall be understood that the described embodiments are illustrative, rather than restrictive. The scope of protection of the present disclosure shall be interpreted based on the claims appended below, and it shall be interpreted that any and every technical idea within the equivalent scope is encompassed in the claims of the present disclosure.

INDUSTRIAL APPLICABILITY

With the rising demand for foldable displays, product performance such as visibility has become increasingly important. According to the present disclosure, it is possible to enhance product reliability by improving the wrinkles in the display panel overlapping the folding area. Therefore, the present disclosure is highly applicable in the industry.

What is claimed is:

1. A foldable display apparatus, comprising:

a display panel defined with a flat area and a folding area folded about an extended folding axis defined along a first direction and configured for displaying an image;

a support plate disposed beneath the display panel and overlapping with the flat area; and an adhesive layer configured for fixing the display panel and the support plate, wherein the adhesive layer is arranged to overlap with the flat area of the display panel and be non-overlapping with the folding area of the display panel, wherein the adhesive layer comprises a first adhesive layer and a second adhesive layer, the first adhesive layer and the second adhesive being spaced apart from each other in the first direction, wherein, in a plan view, the first adhesive layer is disposed along a first side extending in a second direction intersecting the first direction of the display panel, and wherein, in a plan view, the second adhesive layer is disposed along a second side extending in the second direction of the display panel and facing the first side.

2. The foldable display apparatus according to claim 1, wherein, in a plan view, the first adhesive layer and the second adhesive layer are not disposed in an area extending from the center of the folding area to the flat area in the first direction.

3. The foldable display apparatus according to claim 1, wherein the adhesive layer further comprises a third adhesive layer disposed along a third side extending in the first direction of the display panel.

4. The foldable display apparatus according to claim 1, wherein the first adhesive layer and the second adhesive layer are interposed between the display panel and the support plate and adhered to the support plate and the display panel.

5. The foldable display apparatus according to claim 1, further comprising a resin layer attached to the support plate and the display panel, wherein the resin layer comprises a first resin layer and a second resin layer, the first resin layer and the second resin layer being spaced apart from each other in the first direction, wherein the first resin layer is disposed along the first side of the display panel, wherein the second resin layer is disposed along the second side of the display panel, wherein the first adhesive layer is disposed underneath the first resin layer such that the first resin layer is attached to the display panel and the support plate by the first adhesive layer, and wherein the second adhesive layer is disposed underneath the second resin layer such that the second resin layer is attached to the display panel and the support plate by the second adhesive layer.

6. The foldable display apparatus according to claim 5, wherein the first resin layer and the first adhesive layer have a width in the first direction so as to overlap the display panel and the support plate around the first side of the display panel, and wherein the second resin layer and the second adhesive layer have a width in the first direction so as to overlap the display panel and the support plate around the second side of the display panel.

7. The foldable display apparatus according to claim 1, further comprising a cover layer disposed on the display panel to cover a front face of the display panel, wherein the first adhesive layer and the second adhesive layer are disposed underneath the cover layer such that the cover layer is attached to the display panel and the support plate by the first and second adhesive layers.

8. The foldable display apparatus according to claim 7, wherein the first adhesive layer has a width in the first direction so as to overlap the display panel and the support plate around the first side of the display panel, and wherein the second adhesive layer has a width in the first direction so as to overlap the display panel and the support plate around the second side of the display panel.

9. The foldable display apparatus according to claim 7, wherein the first adhesive layer and the second adhesive layer are non-overlapping with the display panel and are overlapping with the support plate, wherein the first adhesive layer is arranged to attach the support plate and the cover layer at an outer edge of the first side of the display panel, and wherein the second adhesive layer is arranged to attach the support plate and the cover layer at an outer edge of the second side of the display panel.

10. The foldable display apparatus according to claim 1, further comprising a cover layer disposed on the display panel to cover a front face of the display panel, wherein the cover layer is arranged to wrap around the sides of the display panel and the sides of the support plate and is fixed to a bottom of the support plate by the adhesive layer.

11. The foldable display apparatus according to claim 10, wherein the first adhesive layer and the second adhesive layer are disposed underneath the support plate to attach an end portion of the cover layer, wrapping around the display panel and the support plate, and the bottom of the support plate.

12. The foldable display apparatus according to claim 1, wherein each of the first adhesive layer and the second adhesive layer comprises a plurality of sub-adhesive layers, and sub-adhesive layers included in the first adhesive layer and sub-adhesive layers included in the second adhesive layer are spaced apart from each other in the second direction.

13. A foldable display apparatus, comprising:

a display panel defined with a flat area and a folding area folded about an extended folding axis defined along a first direction and configured for displaying an image;

a support plate disposed beneath the display panel and overlapping with the flat area; and an adhesive layer configured for fixing the display panel and the support plate, wherein the adhesive layer comprises a first adhesive layer and a second adhesive layer, the first adhesive layer and the second adhesive being spaced apart from each other in the first direction, wherein, in a plan view, the first adhesive layer is disposed along a first side extending in a second direction intersecting the first direction of the display panel, wherein, in a plan view, the second adhesive layer is disposed along a second side extending in the second direction of the display panel and facing the first side, and wherein, in a plan view, the first adhesive layer and the second adhesive layer are not disposed in an area extending from the center of the folding area to the flat area in the first direction.

* * * * *